United States Patent [19]

Tanaka et al.

[11] Patent Number: 4,975,544
[45] Date of Patent: Dec. 4, 1990

[54] CONNECTING STRUCTURE FOR CONNECTING CONDUCTORS IN AN ELECTRONIC APPARATUS

[75] Inventors: Nobuyuki Tanaka, Kuwana; Taichi Saitoh, Yokohama; Akio Kiso; Hideo Tokuda, both of Kawasaki; Tetsuya Nakajima, Yokohama; Minoru Takagi, Kasugai, all of Japan

[73] Assignees: Fujitsu Limited, Kawasaki; Fujitsu Vlsi Limited, Kasugai, both of Japan

[21] Appl. No.: 323,757

[22] Filed: Mar. 15, 1989

[30] Foreign Application Priority Data

Mar. 18, 1988 [JP] Japan ................................. 63-65014

[51] Int. Cl.$^5$ .............................................. H01R 4/00
[52] U.S. Cl. .................................. 174/94 R; 174/264; 357/68; 361/406
[58] Field of Search ...................... 174/94 R, 68.5, 264; 357/68, 71; 427/97; 361/406

[56] References Cited

U.S. PATENT DOCUMENTS

| 4,631,569 | 12/1986 | Calhoun | 357/71 |
| 4,789,760 | 12/1988 | Koyama et al. | 427/97 |
| 4,803,541 | 2/1989 | Kouda | 357/68 |

Primary Examiner—Morris H. Nimmo
Attorney, Agent, or Firm—Staas & Halsey

[57] ABSTRACT

A connecting structure for connecting conductors used for wiring in a semiconductor device comprises a first conductor provided on a part of the semiconductor device for passing the flow of electrons, an insulator provided on the first conductor and formed with a contact hole, and a second conductor provided on the insulator for passing the flow of electrons, in which the second conductor is provided so as to sandwich the insulator together with a part of the first conductor. The first and second conductors are contacted to each other across the insulator at the contact hole so that the electrons flow through the contact hole. The contact hole extends in a general direction of a flow of electrons passing therethrough and has a stepped shape in which a width measured perpendicularly to the general direction of the flow of electrons increases stepwise towards the general direction of the flow of electrons.

17 Claims, 13 Drawing Sheets

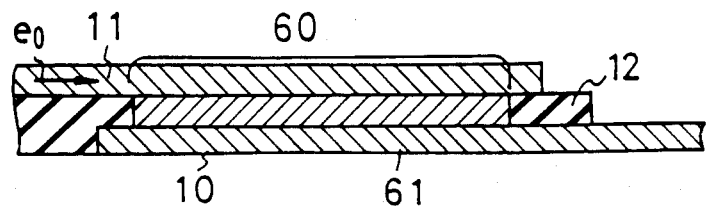
FIG.15
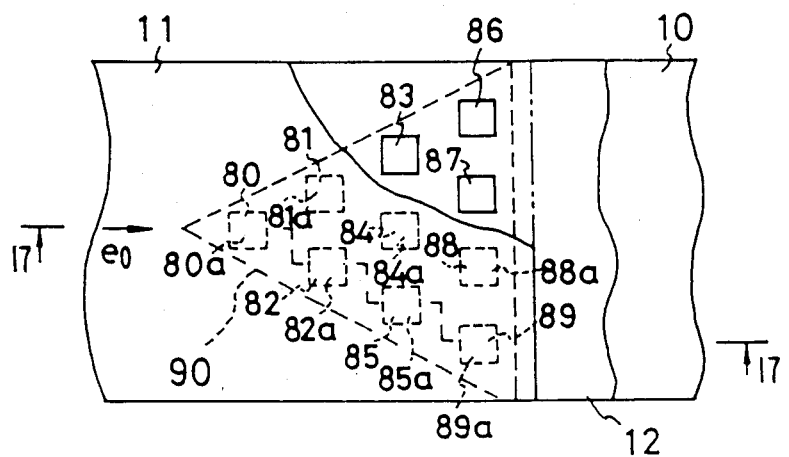
FIG.16
FIG.17
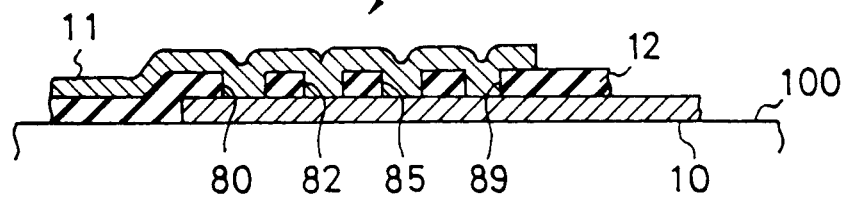

CONNECTING STRUCTURE FOR CONNECTING CONDUCTORS IN AN ELECTRONIC APPARATUS

BACKGROUND OF THE INVENTION

The present invention generally relates to wiring of electronic apparatus and more particularly to a connecting structure of conductors used for connecting conductors in an electronic apparatus such as a semiconductor device.

In a semiconductor device such as an integrated circuit, there are cases that a conductor used for wiring at one side of an insulator layer is connected to another conductor at the other side of the insulator layer. For that purpose, a connecting part is formed, contactings the two conductors, extending through the insulator layer.

When the semiconductor device is used, such a connecting part tends to invite a concentration of electron flow which causes an electromigration in the conductor. The electromigration is a phenomenon in which an atom of the conductor is displaced from its original position by the impact of electron flowing in a direction. The electromigration of aluminium is well known. When the electromigration proceeds excessively, a large number of atoms of the conductor at the connecting part are displaced by the impacting electrons and the contact between the two conductors is degraded or lost. In other words, the connecting part is destroyed by an electron current or flow, and the two conductors are disconnected. Such a disconnection of the wiring in the semiconductor device limits the lifetime of the semiconductor device.

As the rest of the part of the semiconductor device is still capable of continuing its operation, the lifetime of the semiconductor device can be extended when the lifetime of the connecting part is extended. For this purpose it is necessary to solve the problem of degradation of the contact by the electromigration.

In order to reduce the effect of electromigration, it is desired to reduce or minimize the concentration of electron flow passing through the connecting part at a particular location of the connecting part.

Conventionally, there is a connecting structure comprising numerous contacting parts disposed in a row and column formation with a substantial mutual separation such that the contacting parts are aligned alternately. Such a structure, though capable of reducing the electromigration effect, has a limitation in that the conductor to be connected should have a relatively large width. For example, a width of about 100 $\mu$m or more is required for the conductor when a pair of conductors are connected by three or four rows of connecting parts each including two or three connecting parts with a size of about 10 $\mu$m $\times$ 10 $\mu$m. Thus, such a conventional connecting structure cannot be used for wiring patterns having a conductor with a substantially small width such as 50 $\mu$m or less.

Further, there is a known connecting structure in which a pair of conductors at both sides of an insulating layer make a contact at a plurality of contacts which are aligned in a plurality of rows extending in a direction of flow of electron. In one construction shown in FIG. 1, two rows of contacts 1 and 2 each including three or more contacts $1a$-$1c$, $2a$-$2c$ therein are provided in which the size of the contact is made identical except for the first contact $1a$, $2a$, at a most upstream side of a flow of electron e, which is made to have a smaller width than the rest of the contacts in the row. In such a construction, there is a problem that the electron flow e is mainly concentrated to the first contact(s) $1a$, $2a$ having the small size although some of the electrons are received by a part of the second contact(s) $1b$, $2b$ extending into a path of the flow of electron beyond the small sized first contact(s) $1a$, $2a$, and the first contact(s) becomes defective after a short period of time. This is because the third contact(s) $1c$, $2c$ having the size identical to the size of the second contact $1b$, $2b$ is in the shadow of the flow of of electron formed behind the second contact(s) and does not contribute to the conduction of the electron flow e. Once the first contact is gone, the second contact behind the first contact is subjected to the heavy concentration of the electron flow and becomes defective after a short period of time. After the second contact, the third contact becomes defective similarly. Thus, such a conventional connecting structure, provides only a limited lifetime.

SUMMARY OF THE INVENTION

Accordingly, it is a general object of the present invention to provide a novel and useful connecting structure for connecting conductors used for wiring in an electronic apparatus wherein the problems aforementioned are eliminated.

Another and more specific object of the present invention is to provide a connecting structure for connecting conductors in an electronic apparatus, wherein the effect of electromigration is minimized.

Another object of the present invention is to provide a connecting structure of an electronic apparatus for connecting conductors provided on opposite sides of an insulating layer, wherein a first conductor at a first side of the insulating layer makes a contact with the second conductor at the other side of the insulating layer at a region having a width which increases successively from an upstream side to a downstream side of an electron flow passing through the connecting structure. According to the present invention, the electron flow is spreaded over the entire connecting structure and the concentration of the electron flow at a particular location of the connecting structure is avoided. As a result, the electromigration due to the concentration of the electron flow is minimized and the degradation of the connecting structure is suppressed.

Other objects and further features of the present invention will become apparent from the following detailed description when read in conjunction with attached drawings.

BRIEF DESCRIPTION OF THE DRAWINGS

FIG. 15 is a cross sectional view of the connecting structure of FIG. 11 along the line 15—15 in FIG. 13;

FIG. 16 is a perspective view showing still other embodiment of the connecting structure of the present invention;

FIG. 17 is a cross sectional view of the connecting structure of FIG. 16 along the segmented and stepped line 17—17 in of FIG. 16.

DETAILED DESCRIPTION

Figure 1:
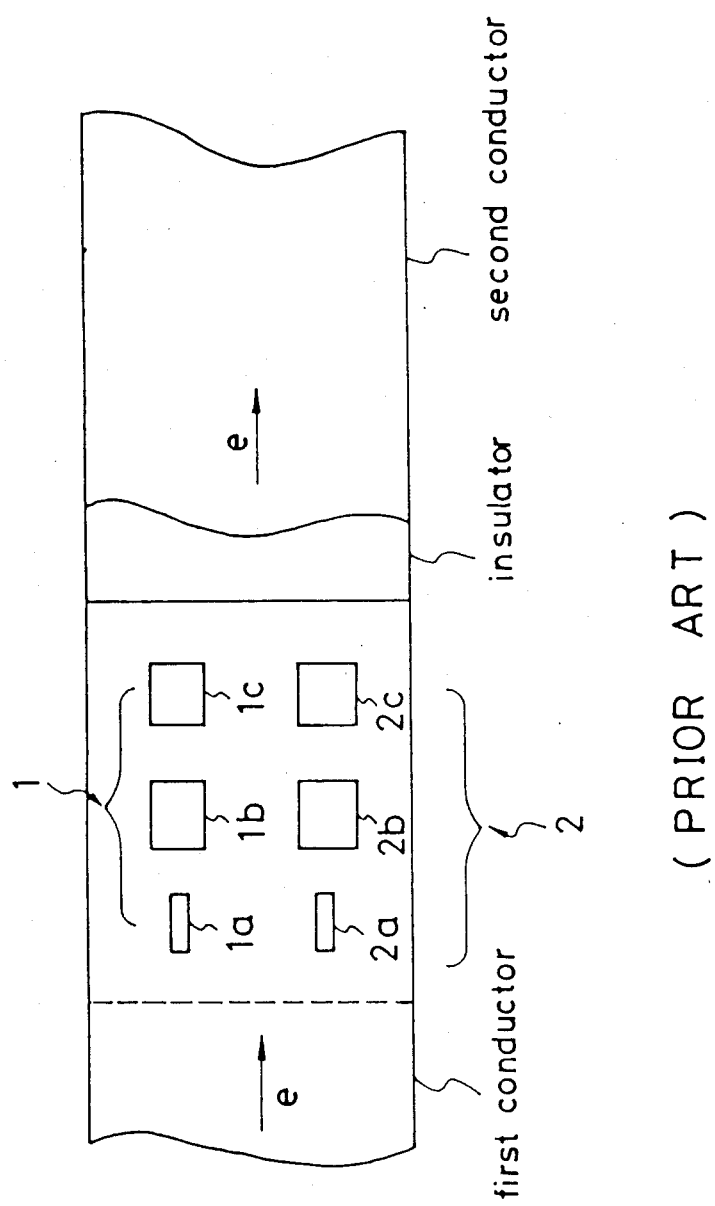
FIG. 1 is a plan view showing a prior art connecting structure which extends through an insulator for connecting conductors across an positioned on opposite sides of the insulator.
Figure 2:
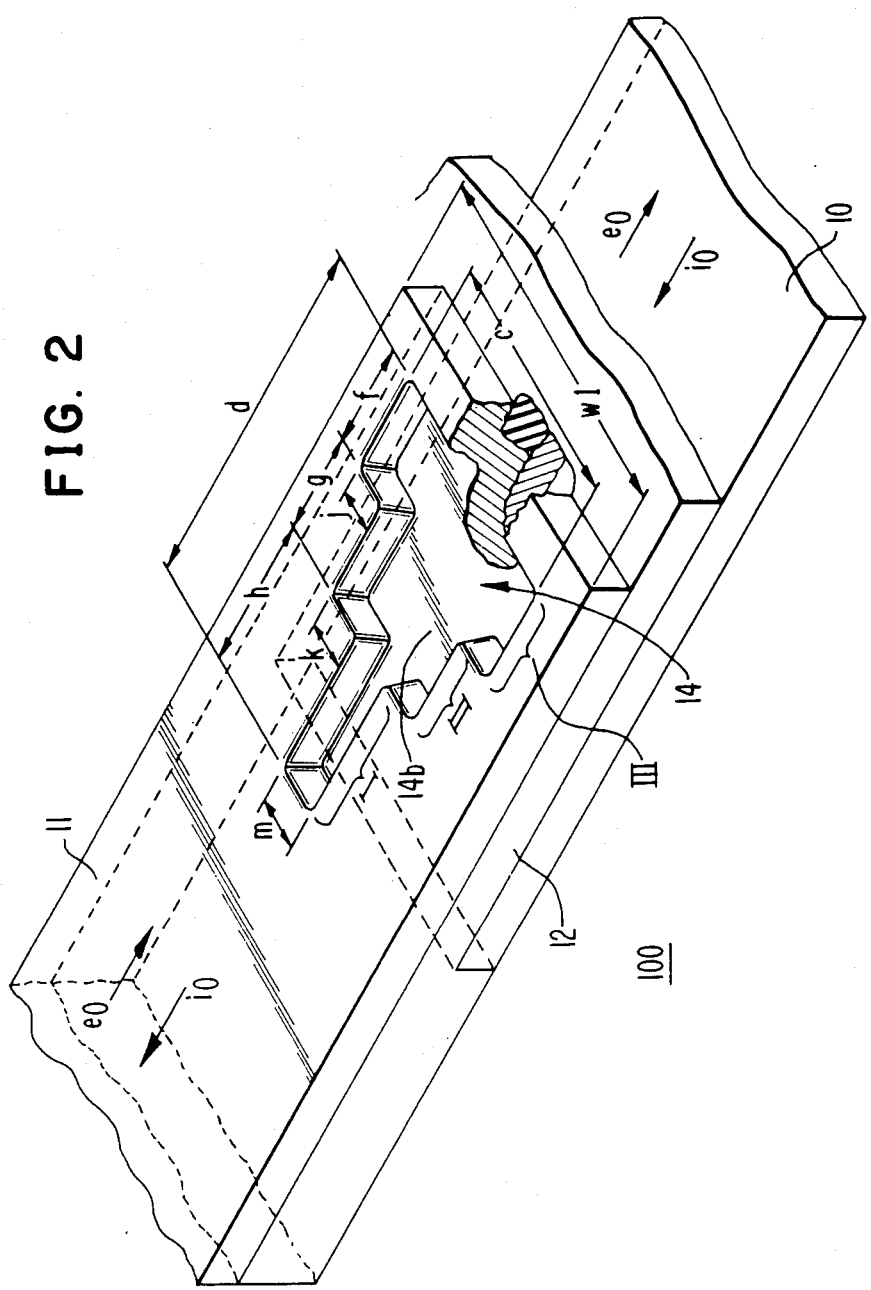
FIG. 2 is a perspective view showing an embodiment of a connecting structure of the present invention in which an electrical current is passed in one direction.

FIG. 2 shows a first embodiment of the connecting structure of the present invention. Referring to the drawing, the connecting structure comprises a first conductor 10 such as aluminium deposited on a substrate or a semiconductor device 100, an insulator 12 deposited on the first conductor 10, and a second conductor 11 further deposited on the insulator 12. The deposition may be made by sputtering, for example. The first conductor 10 and the second conductor 11 are patterned to have a width W1 and the second conductor 11 is deposited so that at least a part of the conductor 11 overlaps with a part of the conductor 10.

Figure 3:
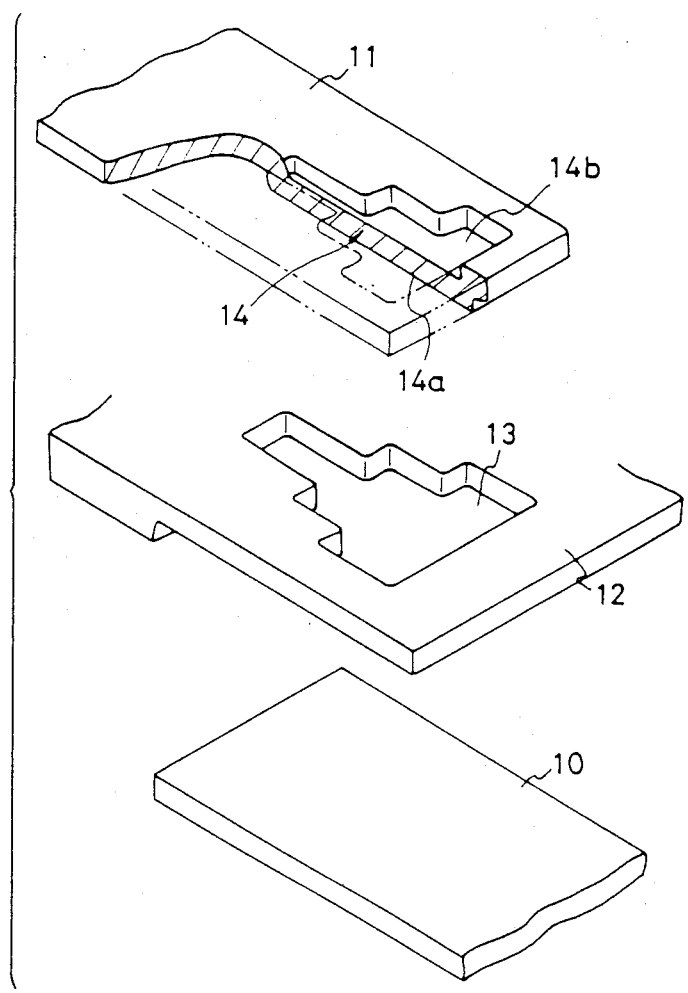
FIG. 3 is an exploded view showing the connecting structure of FIG. 2.
Figure 6:
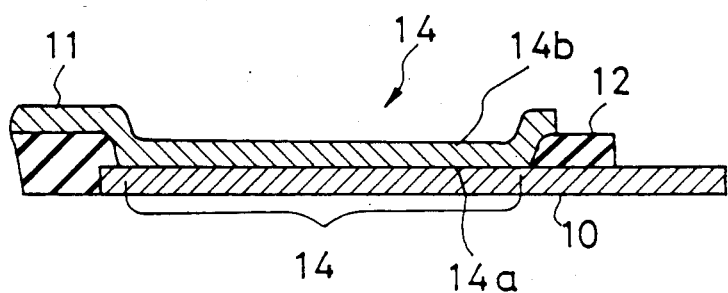
FIG. 6 is a cross sectional view showing the structure of FIG. 2 along the line 6—6 of FIG. 5.

As can be seen from an exploded view of FIG. 3, the insulator 12 is defined with a penetrating opening or aperture 13, and the conductor 10 makes a contact with the conductor 11 through this aperture 13. As the conductor 11 is deposited on the insulator 12 defined with the aperture 13, the conductor 11 forms a projection 14a on its bottom surface at a part 14 having a shape corresponding to the shape of the aperture 13. This projection 14a projects downwards from the conductor 11 as clearly seen in the cross sectional view of FIG. 6 and makes a contact with the conductor 10 underneath the insulator 12. The connecting structure thus comprises a part of the first conductor 10 and a part of the second conductor 11 contacting each other at the part 14. Because of this reason, the part 14 will be referred to hereinafter as the connecting part.

FIG. 2 shows a depression 14b formed on the top surface of the conductor 11 in correspondence to the projection 14a at the bottom of the conductor 11. This depression 14b is clearly seen in the cross sectional view of FIG. 6. Hereinafter, the shape of the connecting part 14 will be represented by the corresponding shape of the depression 14b on the top surface of the conductor 11. In the structure of FIG. 2, the part 14 is symmetrical with respect to the direction of the flow of electron. In other words, the connecting part 14 is symmetrical about an axis of symmetry which extends along the direction of an electron flow indicated by an arrow $e_0$ in FIG. 2.

The structure of FIG. 2 is designed such that the electrical current flows from the conductor 10 to the conductor 11 as indicated by an arrow $i_0$. In correspondence thereto, the electron flows from the conductor 11 to the conductor 10 across the connecting part 14 as indicated by the arrow $e_0$. It should be noted that the connecting part 14 has a width which narrows successively in a stepped manner towards the downstream side of the electrical current $i_0$. In other words, the connecting part 14 has a width which increases sequentially in a stepped manner towards the downstream side of the electron flow $e_0$. For simplicity of the description, the electrical current flowing through the connecting part 14 will be described hereinafter in terms of the electron flow alone. In other words, the term "upstream side" and "downstream side" mean hereinafter the upstream side and the downstream side of the electron flow $e_0$. Thus, a part I at the most upstream side of the connecting part 14 has a width m which is about 8 μm and extends along the direction of the electron flow $e_0$ of a length h which is about 20 μm. This most upstream part I is succeeded by a second upstream part II having a length g of about 15 μm in the direction of the electron flow $e_0$. This second upstream part II has a width which is given by m+2k. In other words, the width of the part II is increased stepwise by a step k symmetrically in each of the opposite directions, perpendicular to the direction of the electron flow $e_0$. The value of the step k is about 3 μm. Further, this part II is succeeded by another part III having a length f of about 15 μm and a width of m+2k+2j. In other words, the width of the part III is increased stepwise symmetrically with respect to the direction of the electron flow $e_0$, similarly to the case of the part II, by a step j. The value of the step j is about 3 μm. Thus, the maximum width of the part 14 is about 20 μm and the overall length of the part 14 is about 50 μm.

The lift time of the connecting structure of FIG. 2 was tested for the conductors 10 and 11 having the width W1 of 25 μm. The test was conducted for 50 samples at a temperature of 250° C. by flowing the electrical current of 20 mA in the direction as indicated by the arrow $i_0$, and the elapsed time to the first appearance of defective conduction was measured. Further, for the purpose of comparison, the same test was conducted for a conventional connecting structure having a rectangular shape in which the width is set to 20 μm in correspondence to the maximum width of the part 14 and the length is set to 50 μm in correspondence to the overall length of the part 14.

Figure 4:
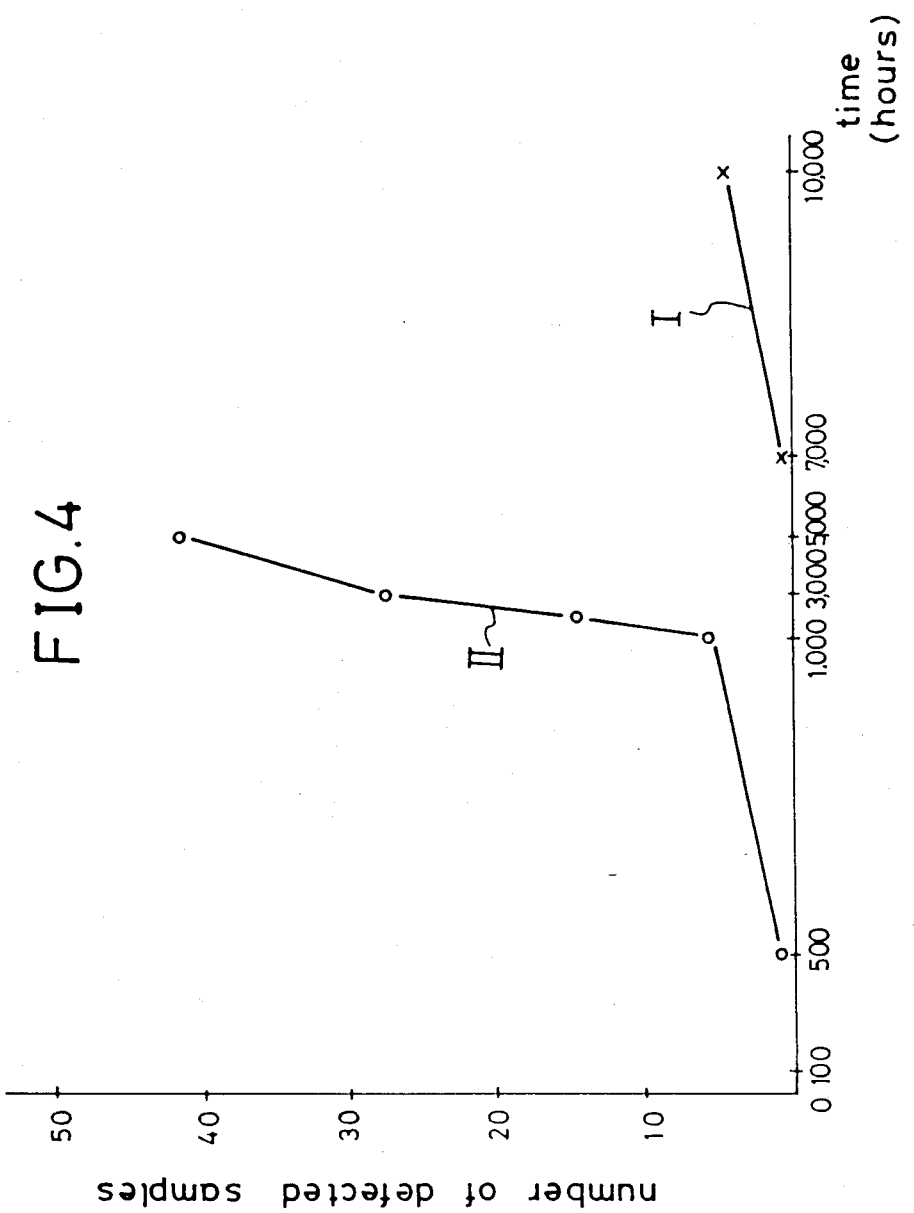
FIG. 4 is a graph showing an experimental result for evaluating the lifetime of the structure of FIG. 2 in comparison with a conventional connecting structure.

FIG. 4 shows the result of the experiment. In FIG. 4, the result for the structure of FIG. 2 is represented by a symbol I and the result for the conventional structure is represented by a symbol II. As is clearly seen in the drawing, the conventional structure gives the first appearance of the defective conduction after 500 hours from the start of the experiment. Thereafter, the number of defective samples increases sharply with time, particularly when the run duration of the experiment has exceeded 1000 hours. By 5000 hours, most of the samples showed defective conduction which means that most of the connection structure is destroyed by this time.

Figure 5:
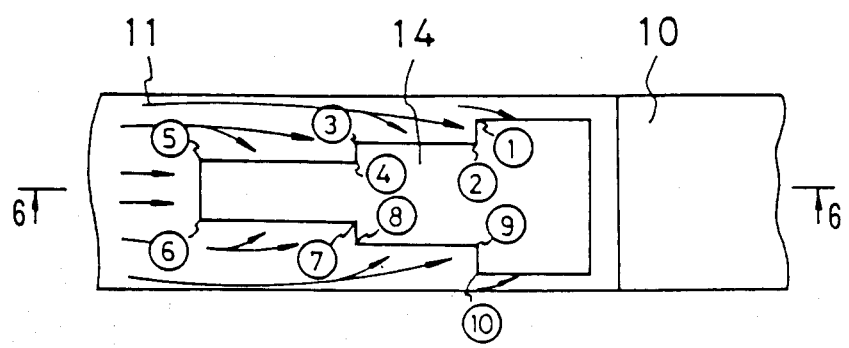
FIG. 5 is a plan view showing the connecting structure of FIG. 2.

In contrast, the structure of FIG. 2 gives the first appearance of defective conduction only after 7000 hours from the start of the experiment. Even after that, the increase in the number of structures having defective conduction is very slow. It should be noted that the total number of structures in which such defects appeared in the experiment is only five, which is ten percent of the samples tested even after 10,000 hours of elapsed time from the start of the experiment. Thus, the experiment clearly demonstrated that the connecting structure of the present invention is far superior than the conventional structure. The reason of this extended lifetime of the connecting structure may be explained as a result of an increased of an increased length in the edge of the connecting part 14 which is defined by points ①, ②, ③, ④, ⑤, ⑥, ⑦, ⑧, ⑨, and ⑩ of the connecting part 14 as shown in FIG. 5. As the electron flows onto the connecting part 14 across the edge are thus defined, the increase in the length of this edge reduces the density of the electrons in the electron flow flowing into the connecting part 14. As a result, concentration of the electrons is avoided and the electromigration is suppressed. In FIG. 5, hypothetical paths of the electron flow are also illustrated for facilitating the understanding. As can be seen, all the edges of the connecting part 14 is used for receiving the electron flow. Thus, there is no edge in the shadow of the flow electrons.

Thus, the connecting structure of FIG. 2 significantly increases the lifetime of the semiconductor device such as an integrated circuit and is particularly well suited for connecting power conductors in an integrated circuit in which a large electrical current is passed.

Figure 7:
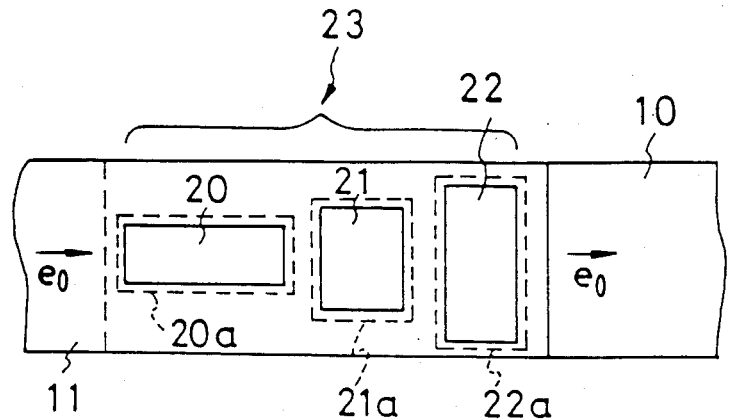
FIG. 7 is a plan view showing a modification of the connecting structure of FIG. 2.

FIG. 7 shows a modification of the embodiment of FIG. 2. In the drawing, these parts constructed identically with those corresponding parts of the preceding drawings are given identical reference numerals and the description thereof will be omitted.

In this modification, the parts I, II and III of the connecting part 14 as in FIG. 2 are separated and the structure comprises a first connecting part 20, a second connecting part 21 and a third connecting part 22 which are separate from each other. In correspondence thereto, separate apertures 20a, 21a and 22a are formed in the insulator 12 as illustrated by a broken line in FIG. 7. It should be noted that the respective widths of the parts 20, 21 and 22 correspond to the widths of the parts I, II and III of FIG. 2 and increase successively in a stepped manner from the upstream side to the downstream side of the electron flow $e_0$. This modification is less favorable as the connecting parts 20 and 21 gives shadow to the respective, subsequent connecting parts. In order to avoid this effect of shadow of the electron flow, one must choose a sufficient mutual separation between the parts 20, 21 and 22.

Figure 8:
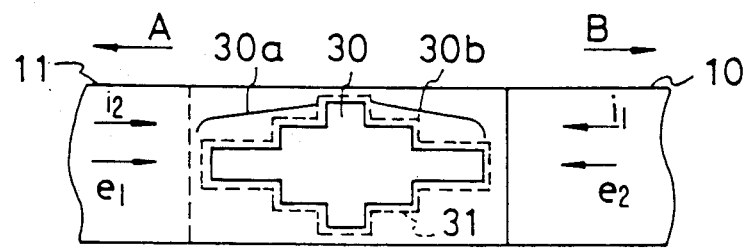
FIG. 8 is a plan view showing another modification of the connecting structure of FIG. 2 for a case in which the electrical current flows in both directions.

FIG. 8 is a modification of the structure of FIG. 2 in which the flow of electrons is bidirectional. In this drawing, too, those parts constructed identically to those corresponding parts of the preceding drawings are given identical reference numerals and the description thereof will be omitted.

In this structure, the connecting part 30 has a structure in which the width of the connecting part increases, stepwise, with the flow of electrons and then decreases, again stepwise. Corresponding to the shape of the connecting part 30, an aperture 31 having a corresponding shape is formed in the insulator 12 as illustrated in FIG. 8 by a broken line. In this structure, a part 30a which is the left half of the part 30 receives the flow of electrons $e_1$, flowing from the left to the right of the drawing, and a part 30b at the right half of the part 30 receives the flow of electrons $e_2$, flowing from the right to the left of the drawing. It should be noted that the width of the part 30a increases successively in stepped manner towards the downstream side of the electron flow $e_1$ and the width of the part 30b increases successively in stepped manner towards the downstream side of the electron flow $e_2$.

Figure 9:
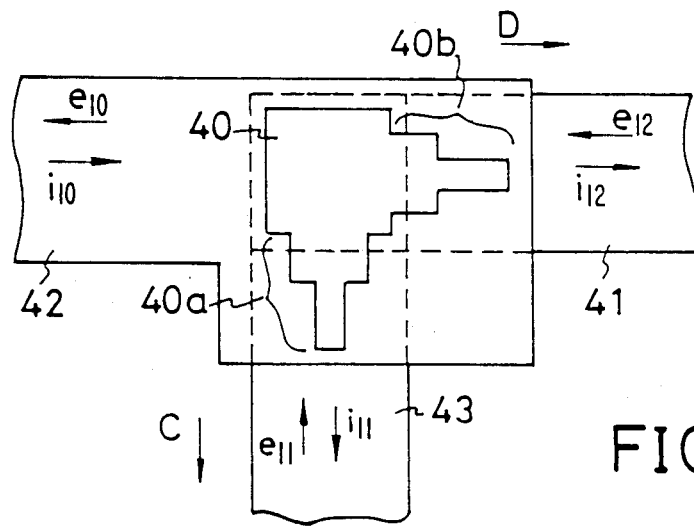
FIG. 9 is a plan view showing a modification of the connecting structure of FIG. 2 in which plural electrical current flows merge together at the connecting structure.
Figure 10:
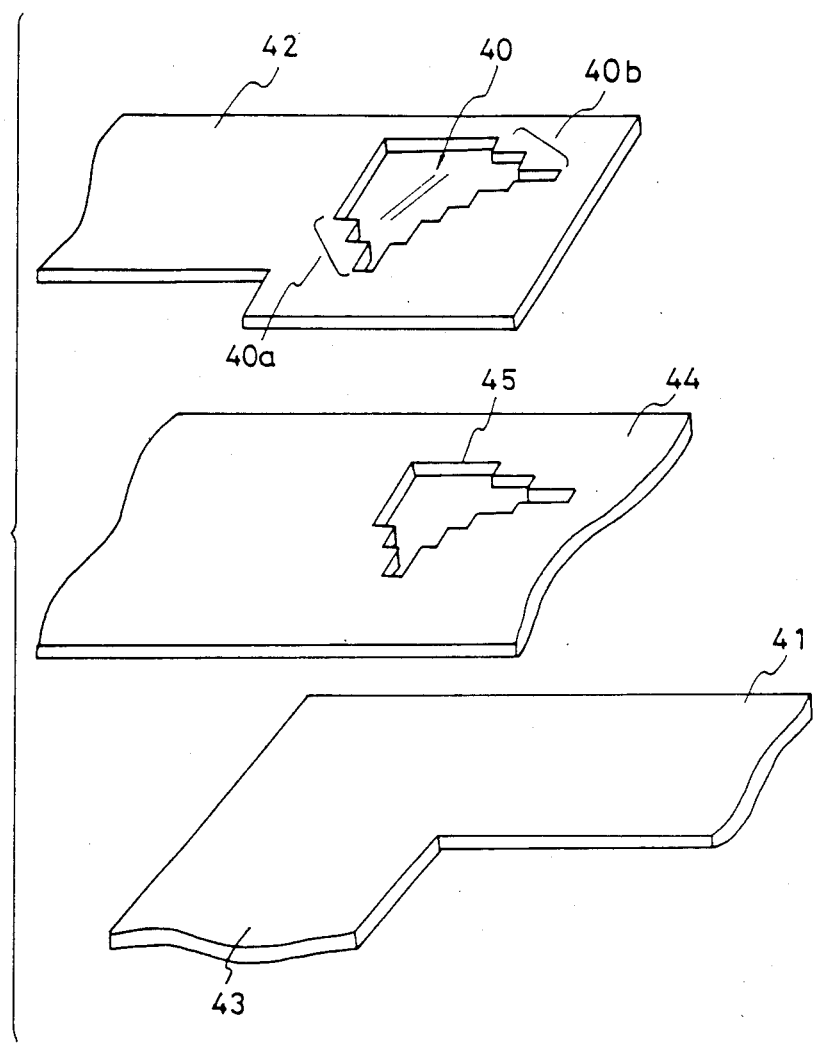
FIG. 10 is an exploded view showing the connecting structure of FIG. 9.

FIGS. 9 and 10 show a modification of the structure of FIG. 2 in which an electron flow $e_{12}$ flowing from a conductor 41 to another conductor 42 is merged with another electron flow $e_{11}$ flowing from still other conductor 43 extending perpendicularly to the conductor 41 to the conductor 42. As can be seen from the exploded view, the conductors 41 and 43 are branched and the conductor 42 is separated from the conductors 41 and 43 by an insulator 44 defined with an aperture 45 which defines a shape of the connecting part 40. In this modification, the connecting part 40 corresponding to the aperture 45 is branched into a pair of branched parts 40a and 40b, and the branched part 40a extends towards the conductor 43 and and the branched part 40b extends towards the conductor 41. In each of the branched parts 40a and 40b, the width of the branched part is increased successively in a stepped manner towards the downstream side of the electron flow. Referring to FIG. 9, the width of the branched part 40a increases successively towards the downstream side of the flow of the electron flow $e_{11}$, and the width of the branched part 40b increases successively towards the downstream side of the electron flow $e_{12}$.

Figure 11:
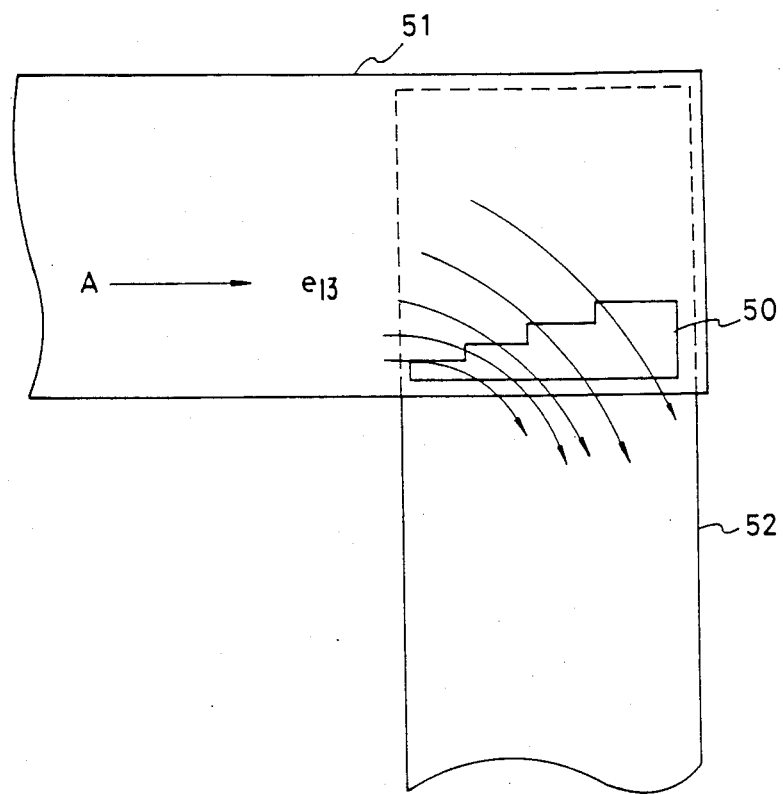
FIG. 11 is a plan view showing a modification of the connecting structure of FIG. 2 in which the electrical current is bent perpendicularly at the connecting structure.
Figure 12:
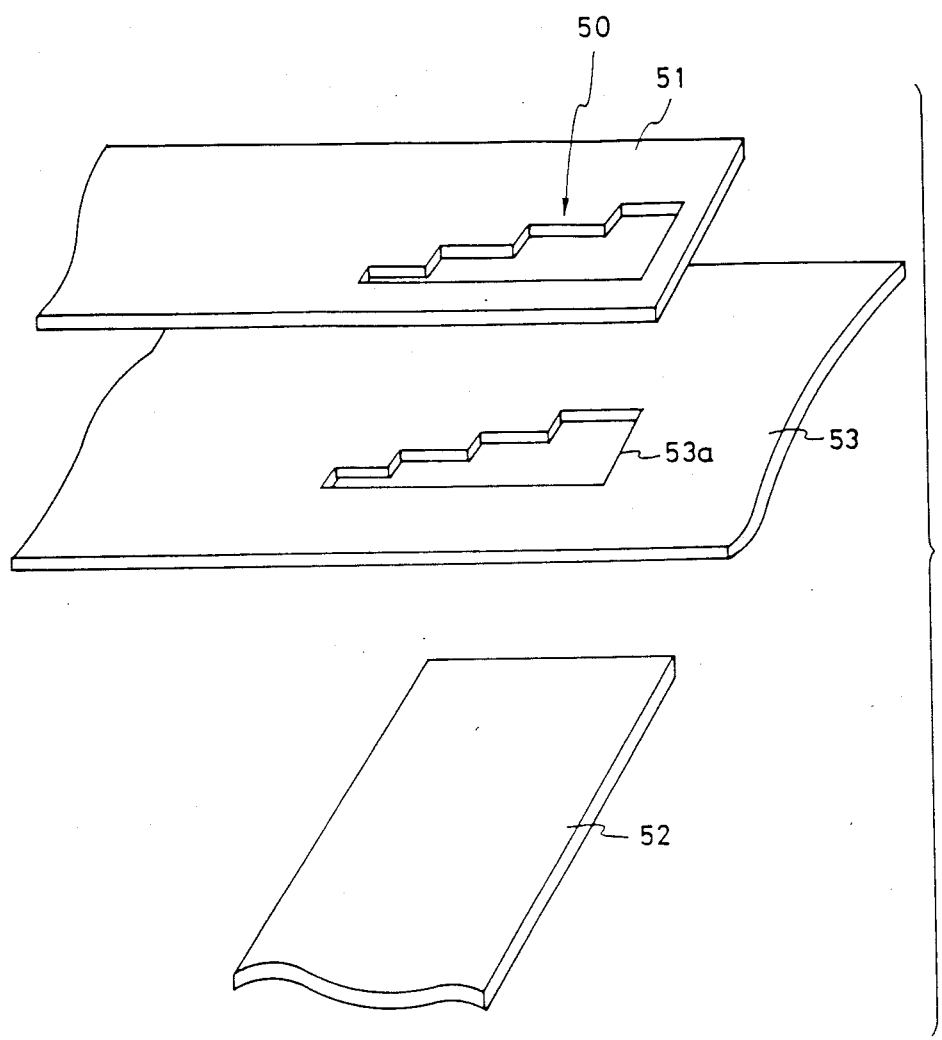
FIG. 12 is an exploded view of the connecting structure of FIG. 11.

FIG. 11 and 12 show another modification of the connecting structure suitable for connecting a first conductor 51 to a second conductor 52 extending perpendicularly to the first conductor 51. An insulator 53 separates the conductors 51 and 52. The connection of the conductors 51 and 52 is made by a connecting part 50 which is defined in correspondence to an aperture 53a formed in the insulator 53 as can be clearly seen from the exploded view of FIG. 12. Referring to the drawing, a flow of electrons $e_{13}$ shown by arrow A in the conductor 51 is curved at a right angle at the connecting part 50 and is then transferred to the conductor 52. In such a bending of the path of the electrons flow, the electron flows along a shortest path. In other words, there appears the heaviest concentration of electron flow at the innermost corner where the conducting path of the electrons is bent as schematically illustrated by a number of arrows in FIG. 11. In order to cope with such a concentration of the electron flow, the connecting part 50 is made asymmetrical. In other words, only an upper half of the connecting part 14 of FIG. 2 is used for the connecting part 50. Even in such a configuration of the connecting part 50, the width of the connecting part 50 is increased successively in a stepped manner along a general direction A of the flow of electrons $e_{13}$, and the flow of electrons is spread over the numerous steps of the connecting part 50. Thus, the concentration of the electron flow on a particular part of the connecting part 50 is avoided and the effect of electromigration is minimized.

Figure 13:
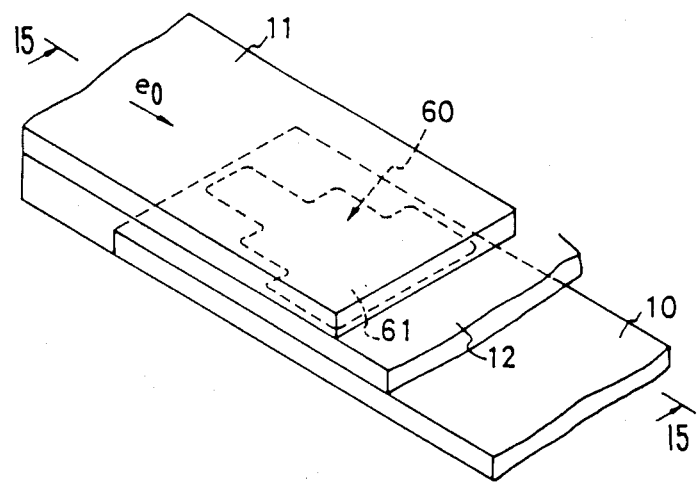
FIG. 13 is a perspective view showing another embodiment of the connecting structure of the present invention.
Figure 14:
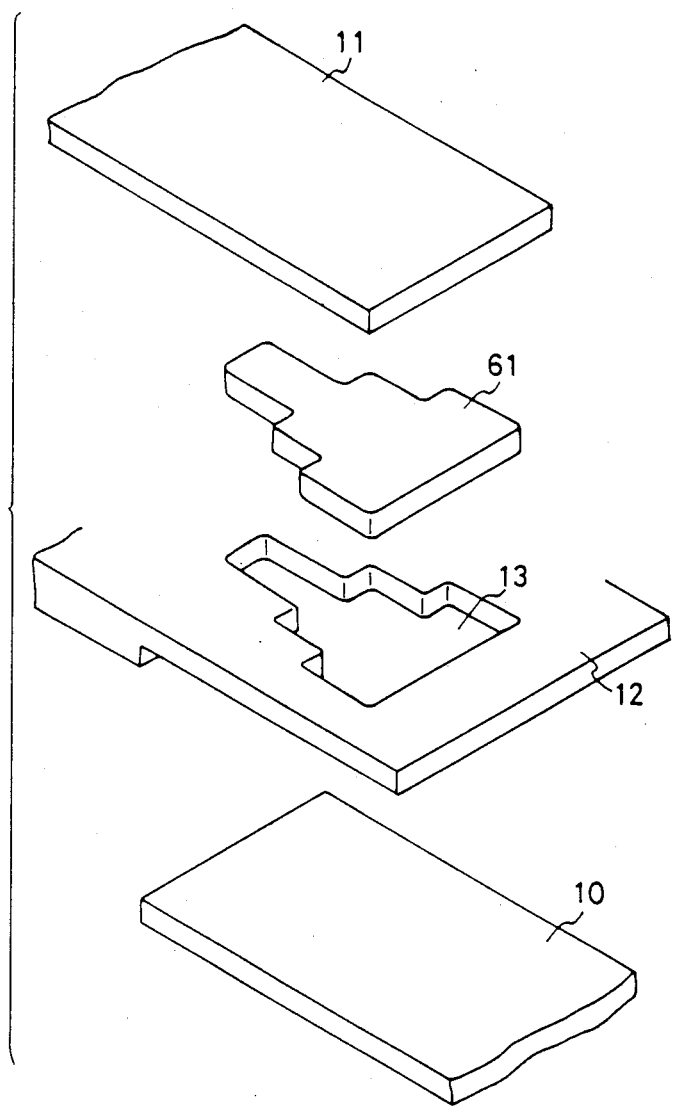
FIG. 14 is a perspective view showing the connecting structure of FIG. 13 in an exploded state.

FIG. 13–15 show another embodiment of the connecting structure of the present invention. In the drawings, those parts constructed identically to those corresponding parts in the preceding drawings are given identical reference numerals and the description thereof will be omitted. In the drawings, FIG. 13 is a perspective view, FIG. 14 is an exploded view, and FIG. 15 is a cross sectional view taken along line 15—15 in FIG. 13.

In the present embodiment, an intervening connecting member 61 is used for connecting the conductors 10 and 11 as the connecting structure 60. The connecting part 60 corresponds to the aperture 13 (FIG. 14) of the insulator 12, and has therefore a shape which is similar to the shape of the connecting part 14.

Referring to FIG. 14, the connecting structure 60 comprises the conductor 10 at the bottom, the insulator 12 having the aperture 13, the intervening member 61 fitted in the aperture 13, and the top conductor 11 deposited on the insulator 12. Thus, the intervening member 60 connects the conductor 11 and the conductor 12 electrically as clearly seen in FIG. 15, and is formed in correspondence to the aperture 13, to provide the corresponding structure 60. As the intervening connecting member 61 thus formed has a width which increases successively in stepped manner towards the downstream side of the electron flow $e_0$, the concentration of the electron flow in the connecting part 60 is avoided and the degradations of the contact provided by the intervening member 61 due to the electromigration is minimized.

FIGS. 16 and 17 show another embodiment of the connecting structure of the present invention. In the drawings, those parts constructed identically to those corresponding parts of the preceding drawings are given identical reference numerals and the description thereof will be omitted.

In this embodiment, the connecting structure uses the insulator 12 formed with a number of penetrating holes 80–89 aligned in a plurality of rows to form a generally triangular formation in which the apex part of the triangle faces the upstream direction of the electron flow $e_0$ and the base part of the triangle faces the downstream direction of the electron flow $e_0$. Each of the holes 80–89 may be a square hole having a size of 10 μm × 10 μm, for example and each row of the holes is separated from another adjacent row by a distance which is at least larger than the size of one hole. Corresponding to the plurality of penetrating holes 80–89, in the connecting part 90, the conductor 11 deposited on the insulator 12 contacts with the conductor 10 under the insulator 12 similarly to the embodiment of FIG. 2. FIG. 17 shows the cross section of the structure of FIG. 16. As can be clearly seen from this cross sectional view, the conductor 11 contacts with the conductor 12 by the connecting part 90 through at the holes 80–99.

It should be noted that the holes 80–89 are aligned alternately in the triangular connecting part 90. More specifically, the hole 80 is formed at the apex part of the connecting part 90 as a first row of the holes and the holes 81 and 82 form a second row behind the hole 80, in which the holes 81 and 82 are disposed with their respective, adjacent sides aligned with corresponding, opposite sides of the hole 80. Similarly, the holes 83, 84 and 85 are aligned as the third row behind the second row of holes 81 and 82 such that the holes 83 and 84 are aligned with the opposite sides of the hole 81 and that the holes 84 and 85 are similarly aligned with the opposite sides of the hole 82. Further, the holes 86–89 are aligned behind the third row to form the fourth row of the holes in which each of the holes 86–89 are located alternately to the holes 83–85 of the third row. As the rows of holes are separated each other by the distance of at least one holes as already described, a hole which is aligned with another hole in the direction of the flow of electron is separated by a distance of at least three holes. Such a distance is sufficient to avoid one hole being in the shadow of the flow of electron caused by another hole, and the connecting part 90 in each of the holes in the thus receives the electron flow uniformly. Corresponding to the arrangement of the holes 80–89, a plurality of contacts 80a–89a which define the connecting, or contacting part 90 are formed and the conductors 10 and 11 make contact to each other at the contacts 80a–89a thus formed.

By configuring the connecting part 90 as such, the electron flow $e_0$ is spread over the entire area of the connecting part 90 and concentration of the electron flow in a particular location of the connecting part is avoided. Further, the contacts 80a–89a are disposed alternately with a suitable mutual separation such that none of the contacts is located in the shadow of the flow of electron formed by another contact. In combining these two effects, the connecting structure of FIG. 16 successfully minimizes the electromigration and the lifetime of the connecting structure is extended.

Figure 18:
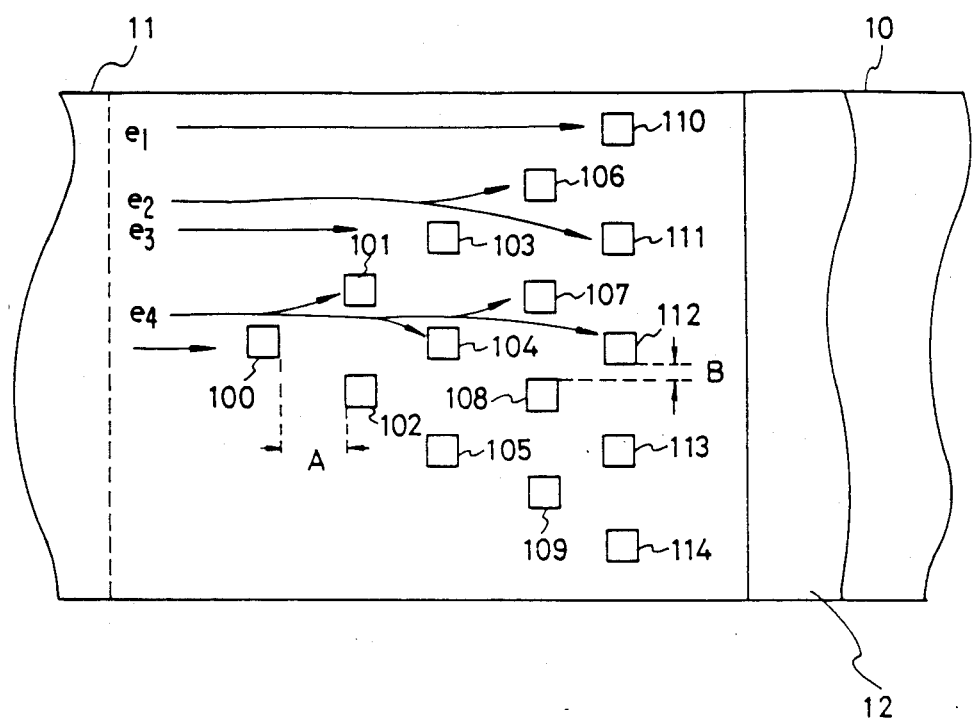
FIG. 18 is a plan view showing still other embodiment of the connecting structure of the present invention.

FIG. 18 shows a modification of the embodiment of FIG. 16. In the drawing, these parts constructed identically to those corresponding parts in FIG. 16 are given identical reference numerals and the description thereof will be omitted.

Referring to FIG. 18, a plurality of contacts 100–114 having a size of 10 μm × 10 μm are disposed generally in a triangular formation similarly to the case of FIG. 16 except that the contacts are arranged in five columns each including a single contact 100, two contacts 101 and 102, three contacts 103–105, four contacts 106–109, and five contacts 110–114, disposed in corresponding holes which are separated by a distance of A which may be chosen to 15 μm. Furthermore, a row of contacts comprising a plurality of contacts aligned in a row such as the contacts 100, 104 and 112 are separated from a neighboring row of contacts such as 102 and 108 by a distance B which may be chosen to 5 μm. According to such a construction, the flow of electrons can penetrate into the connecting structure deeply as indicated by arrows e1–e4 in FIG. 18 and diversification of the electron flow is facilitated.

Although the present invention is described heretofore for the wiring structure of a semiconductor device, the present invention is not limited to the semiconductor device but may be applicable to any electronic apparatus wherein the conductors are connected together through an insulator layer.

Further, the present invention is not limited to these embodiments, but various variations and modifications may be made without departing from the scope of the invention.

What is claimed is:

1. A connecting structure for connecting first and second, spaced electrical conductors so as to pass a flow of electrons from one conductor to the other thereof, comprising:
   a supporting surface;
   a first conductor disposed on the supporting surface for passing the flow of electrons;

an insulator disposed on said first conductor and having a contact hole therein, through which is exposed a portion of the surface of the first conductor;

a second conductor disposed on said insulator for passing the flow of electrons as received from the first conductor, at least respective end portions of the first and second conductors sandwiching the insulator therebetween; and means, conforming substantially to the configuration of the contact hole and extending therethrough, for electrically interconnecting the exposed surface of the first conductor and the second conductor, the interconnecting means defining a general direction of the flow of electrons through the contact hole and thereby from the first conductor to the second conductor, and the contact hole configuration comprising a length dimension in the general direction of the flow of electrons and a width dimension which is perpendicular to the length dimension and increases, stepwise, in the general direction of the flow of electrons in the interconnecting means and thus through the contact hole.

2. A connecting structure as claimed in claim 1, wherein the configuration of said contact hole, and correspondingly of the interconnecting means, comprises at least three stepped width dimensions.

3. A connecting structure as claimed in claim 1, wherein each said stepwise increase in the width dimension of the contact hole is larger than 3 $\mu$m.

4. A connecting structure as claimed in claim 3, wherein each stepped width dimension part of the contact hole has a length dimension of about 15-20 $\mu$m.

5. A connecting structure as claimed in claim 3, wherein said contact hole has a maximum width dimension of about 20 $\mu$m.

6. A connecting structure as claimed in claim 5, wherein said contact hole has an overall length dimension of about 50 $\mu$m.

7. A connection structure as claimed in claim 1, wherein said interconnecting means comprises:

a conductive connecting member configured to correspond to the contact hole and received in said contact hole in the insulator so as to extend between and thereby contact and electrically interconnect the first and second conductors.

8. A connecting structure as claimed in claim 1, wherein the flow of electrons is supplied from one of the first and second conductors to the other of the first and second conductors, and said contact hole extends towards said other conductor which receives the flow of electrons while increasing its width stepwise.

9. A connecting structure as claimed in claim 8, wherein said contact hole extends towards both of said first and second conductors, the width dimension of the contact hole increasing stepwise in a direction from said first conductor to the contact hole and in a direction from said second conductor to the contact hole, respectively.

10. A connecting structure as claimed in claim 8, wherein the flow of electrons is supplied from said first conductor to said second conductor, said first conductor being branched to a first conductive stripe extending in one direction and a second conductive stripe extending in another direction, said contact hole having first and second branched parts respectively extending towards said first and second conductive stripe parts, and the width dimensions of said first and second branched parts increasing stepwise in a direction from said first branched part to said contact hole and in a direction from said second branched part to said contact hole, respectively.

11. A connecting structure as claimed in claim 1, wherein said first conductor and second conductor are disposed relatively to each other in intersecting relationship at least in the portions thereof which sandwich the insulator layer therebetween, one of the conductors supplying electrons to the other conductor whereby a concentration of the flow of electrons occurs at a part of said contact hole, said contact hole increasing in width stepwise, along the general direction of the flow of electrons and at the part where the concentration of the flow of electrons occurs.

12. A connecting structure as claimed in claim 1, wherein said first and second conductors are electrical power conductors used for conducting an electrical power current for operating electronic apparatus.

13. A connecting structure for connecting first and second, spaced electrical conductors so as to pass a flow of electrons from one conductor to the other thereof, comprising:

a supporting surface;

a first conductor disposed on the supporting surface for passing the flow of electrons;

an insulator disposed on said first conductor and having a plurality of contact holes therein, and through which are exposed corresponding portions of the surface of the first conductor;

a second conductor disposed on said insulator for passing the flow of electrons as received from the first conductor, at least respective end portions of the first and second conductors sandwiching the insulator therebetween; and said first and second conductors being contacted to each other across the insulator at said plurality of contact holes to form a connecting area for passing the flow of electrons therebetween, said plurality of contact holes being arranged in a plurality of columns, respectively including one, two, or plural contact holes, extending substantially perpendicularly to the general direction of the flow of electrons passing through the connecting area, and said plurality of columns being arranged in rows in the general direction of the flow of electrons, the number of contact holes in each column increasing successively from each column to the next successive column in the downstream direction of the flow of electrons, and each of said one, two, or plural contact holes in the respective said columns being disposed alternately to the contact holes in the respectively corresponding, successive and next adjacent columns, for the successive, plural columns in said downstream direction of the flow of electrons.

14. A connecting structure as claimed in claim 13, wherein said plurality of contact holes in the insulator is disposed in a generally triangular formation such that the connecting area has a generally triangular shape with an apex facing the general direction of the flow of electrons.

15. A connecting structure as claimed in claim 13, wherein each of said contact holes is of an identical size, and the number of said plurality of columns of contact holes is at least four.

16. A connecting structure as claimed in claim 15, wherein a first said column at a most upstream side of the flow of electrons includes one contact hole, the next successive column in the downstream direction of the flow of electrons includes two contact holes, the further next successive column in the downstream direction of the flow of electrons includes three contact holes, and the still further, next successive column in the downstream direction of the flow of electrons includes four contact holes.

17. A connecting structure as claimed in claim 13, wherein each row of contact holes is separated from an adjacent row of contact holes by a distance sufficient for allowing passage of the electron flow between said adjacent rows of the contact holes.

* * * * *

UNITED STATES PATENT AND TRADEMARK OFFICE
CERTIFICATE OF CORRECTION

PATENT NO. : 4,975,544

DATED : Dec. 4, 1990

INVENTOR(S) : Nobuyuki TANAKA et al.

It is certified that error appears in the above-identified patent and that said Letters Patent is hereby corrected as shown below:

Col. 1, line 15, change "contactings" to --contacting--.

\* Col. 2, line 6, change "electron" to --electrons--;
          line 7, change "contact(s)" to --contact--;
\*         line 10, change "contact" to --contact(s)--;
\*         line 12, delete "of" (third occurrence), and change "electron" to --electrons--;
\*         line 42, change "spreaded" to --spread--;
          line 56, delete "across an";

\* Col. 3, line 27, change "other" to --another--;
          line 32, delete "of";
\*         line 33, change "other" to --another--.

Col. 5, line 19, delete "of an increased" (first occurrence);
\*         line 31, change "is" to --are--.

\* Col. 6, line 29, delete "and" (second occurrence);
          line 51, change "electrons" to --electron--;
          line 52, change "electron flows" to --electrons flow--.

\* Col. 7, line 56, change "80-99" to --80-89--.

UNITED STATES PATENT AND TRADEMARK OFFICE
CERTIFICATE OF CORRECTION

PATENT NO. : 4,975,544

DATED : Dec. 4, 1990

INVENTOR(S) : Nobuyuki TANAKA et al.

It is certified that error appears in the above-identified patent and that said Letters Patent is hereby corrected as shown below:

```
* Col. 8, line 5, after "separated" insert --from--;
*         line 6, change "holes" to --hole--;
*         line 12, delete "in the".
```

Signed and Sealed this

Twenty-sixth Day of May, 1992

*Attest:*

DOUGLAS B. COMER

*Attesting Officer*    *Acting Commissioner of Patents and Trademarks*